US008883287B2

(12) United States Patent
Boyce et al.

(10) Patent No.: US 8,883,287 B2
(45) Date of Patent: Nov. 11, 2014

(54) STRUCTURED MATERIAL SUBSTRATES FOR FLEXIBLE, STRETCHABLE ELECTRONICS

(75) Inventors: Mary C. Boyce, Winchester, MA (US); Simona Socrate, Winchester, MA (US); Christopher M. Boyce, Winchester, MA (US); Brian P. Greviskes, Boston, MA (US)

(73) Assignee: Infinite Corridor Technology, LLC, Winchester, MA (US)

( * ) Notice: Subject to any disclaimer, the term of this patent is extended or adjusted under 35 U.S.C. 154(b) by 281 days.

(21) Appl. No.: 12/822,609

(22) Filed: Jun. 24, 2010

(65) Prior Publication Data

US 2010/0330338 A1 Dec. 30, 2010

Related U.S. Application Data

(60) Provisional application No. 61/221,542, filed on Jun. 29, 2009, provisional application No. 61/265,256, filed on Nov. 30, 2009, provisional application No. 61/320,747, filed on Apr. 4, 2010.

(51) Int. Cl.
| | |
|---|---|
| *B32B 3/24* | (2006.01) |
| *B29C 59/02* | (2006.01) |
| *B29C 59/16* | (2006.01) |
| *H01L 23/498* | (2006.01) |
| *H05K 1/02* | (2006.01) |
| *B32B 3/26* | (2006.01) |

(52) U.S. Cl.
CPC .............. *B29C 59/02* (2013.01); *B32B 3/266* (2013.01); *B29C 59/16* (2013.01); *B29C 2791/009* (2013.01); *B29C 2793/00* (2013.01); *H01L 23/4985* (2013.01); *H01L 2924/3011* (2013.01); *H05K 1/0283* (2013.01); *H05K 2201/0133* (2013.01); *H05K 2201/09063* (2013.01)
USPC ........................................... 428/136; 174/254

(58) Field of Classification Search
CPC ....................................................... B32B 3/266
USPC .......................................... 428/136; 174/254
See application file for complete search history.

(56) References Cited

U.S. PATENT DOCUMENTS

| | | |
|---|---|---|
| 3,519,890 A | 7/1970 | Ashby |
| 4,728,751 A | 3/1988 | Canestaro et al. |
| 4,991,290 A | 2/1991 | MacKay |
| 5,331,183 A | 7/1994 | Sariciftci et al. |
| 5,742,484 A | 4/1998 | Gillette et al. |
| 6,261,863 B1 | 7/2001 | Beroz et al. |
| 6,297,145 B1 | 10/2001 | Ito |
| 6,353,188 B1 | 3/2002 | Fernandez |
| 6,493,933 B1 | 12/2002 | Post et al. |
| 6,743,982 B2 | 6/2004 | Biegelsen et al. |

(Continued)

OTHER PUBLICATIONS

International Search Report and Written Opinion issued in connection with corresponding PCT Application No. PCT/US10/39796, mailed on Feb. 3, 2011.

(Continued)

*Primary Examiner* — William P Watkins, III
(74) *Attorney, Agent, or Firm* — Gesmer Updegrove LLP

(57) ABSTRACT

A flexible and stretchable patterned substrate is provided having a strain-permitting material comprising a patterned conformation that allows the flexible patterned substrate to experience local strain or local strain domains lower than the macroscopic strain of the flexible and stretchable patterned substrate.

20 Claims, 6 Drawing Sheets

(56) References Cited

U.S. PATENT DOCUMENTS

| | | | |
|---|---|---|---|
| 7,101,627 B2 | 9/2006 | MacDonald et al. | |
| 7,265,298 B2 | 9/2007 | Maghribi et al. | |
| 7,337,012 B2 | 2/2008 | Maghribi et al. | |
| 7,465,678 B2 | 12/2008 | Bhattacharya et al. | |
| 7,487,587 B2 | 2/2009 | Vanfleteren et al. | |
| 7,491,892 B2 | 2/2009 | Wagner et al. | |
| 7,517,785 B2 | 4/2009 | Durocher et al. | |
| 7,521,292 B2 | 4/2009 | Rogers et al. | |
| 7,557,367 B2 | 7/2009 | Rogers et al. | |
| 7,629,691 B2 | 12/2009 | Roush et al. | |
| 8,084,117 B2 * | 12/2011 | Lalvani | 428/136 |
| 2002/0053464 A1 | 5/2002 | Schreiber et al. | |
| 2002/0094701 A1 | 7/2002 | Biegelsen et al. | |
| 2002/0117256 A1 | 8/2002 | McCormack et al. | |
| 2002/0153523 A1 | 10/2002 | Bernius et al. | |
| 2004/0192082 A1 | 9/2004 | Wagner et al. | |
| 2006/0286785 A1 | 12/2006 | Rogers et al. | |
| 2008/0157235 A1 | 7/2008 | Rogers et al. | |
| 2009/0107704 A1 | 4/2009 | Vanfleteren et al. | |
| 2009/0317639 A1 | 12/2009 | Axisa et al. | |
| 2010/0002402 A1 | 1/2010 | Rogers et al. | |
| 2010/0009120 A1 | 1/2010 | Boyce et al. | |
| 2010/0096729 A1 | 4/2010 | Wong et al. | |

OTHER PUBLICATIONS

Choi, Won Mook et al. "Biaxially Stretchable "Wavy" Silicon Nanomembranes." Nano Letters, 2007, vol. 7, No. 6, pp. 1655-1663.

Khang, Dahl-Young et al. "A Stretchable Form of Single-Crystal Silicon for High-Performance Electronics on Rubber Substrates." Science Magazine, Jan. 2006, vol. 311, pp. 208-212.

Wagner, Sigurd et al. "Electronic Skin: architecture and components." Physica E, 2004, vol. 25., pp. 326-334.

Jiang, Hanging et al. Reprint of "Post-buckling analysis for the precisely controlled buckling of thin film encapsulated by elastomeric substrates." International Journal of Soldis and Structures, 2008, vol. 45, pp. 3858-3867.

Lacour, Stephanie et al. "Mechanisms of reversible stretchability of thin metal films on elastomeric substrates." Applied Physics Letters, 2006, vol. 88, pp. 204103 1-3.

Lacour, Stephanie et al. "Stiff subcircuit islands of diamondlike carbon for stretchable electronics." Journal of Applied Physics, 2006, vol. 100, pp. 014913 1-6.

Mullin, T. et al. "Pattern Transformation Triggered by Deformation." Physical Review Letters, 2007, vol. 99, pp. 084301 1-4.

Bertoldi, K et al. "Wave propagation and instabilities in monolithic and periodically structured elastomeric materials undergoing large deformations." Physical Review B, 2008, vol. 78, pp. 184107 1-16.

Bertoldi, K et al. "Mechanically triggered transformations of phononic band gaps in periodic elastomeric structures." Physical Review B, 2008, vol. 77, pp. 052105 1-4.

Bertoldi, K et al. "Mechanics of deformation-triggered pattern transformations and superelastic behavior in periodic elastomeric structures." Journal of the Mechanics and Physics of Solids, 2008, vol. 56, pp. 2642-2668.

* cited by examiner

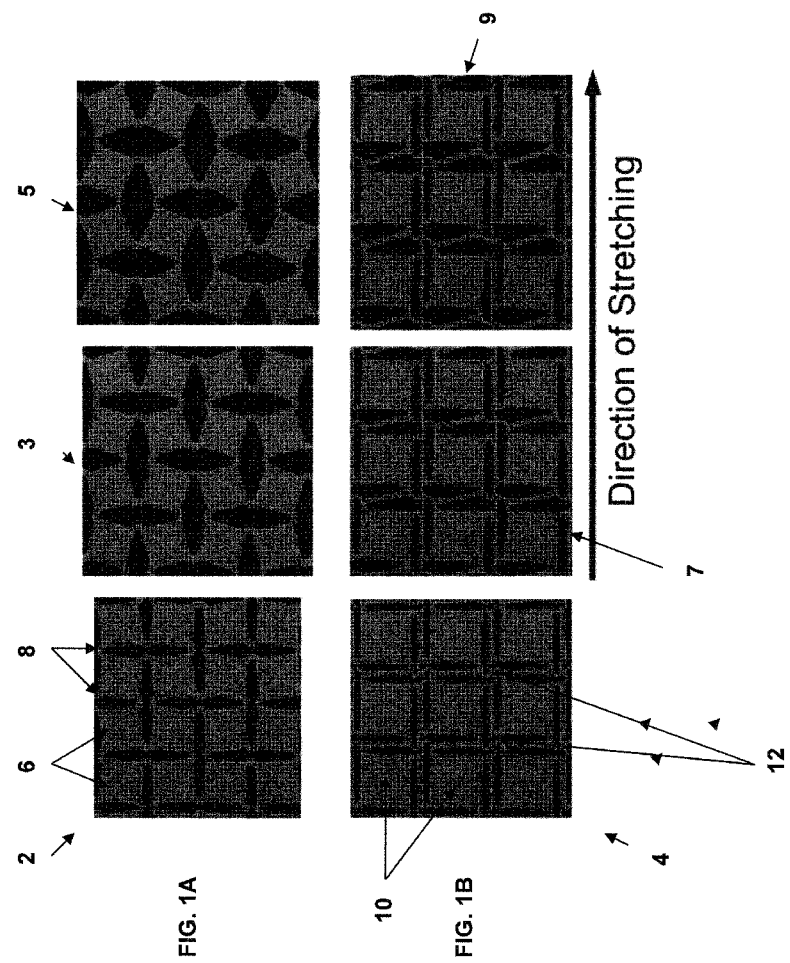

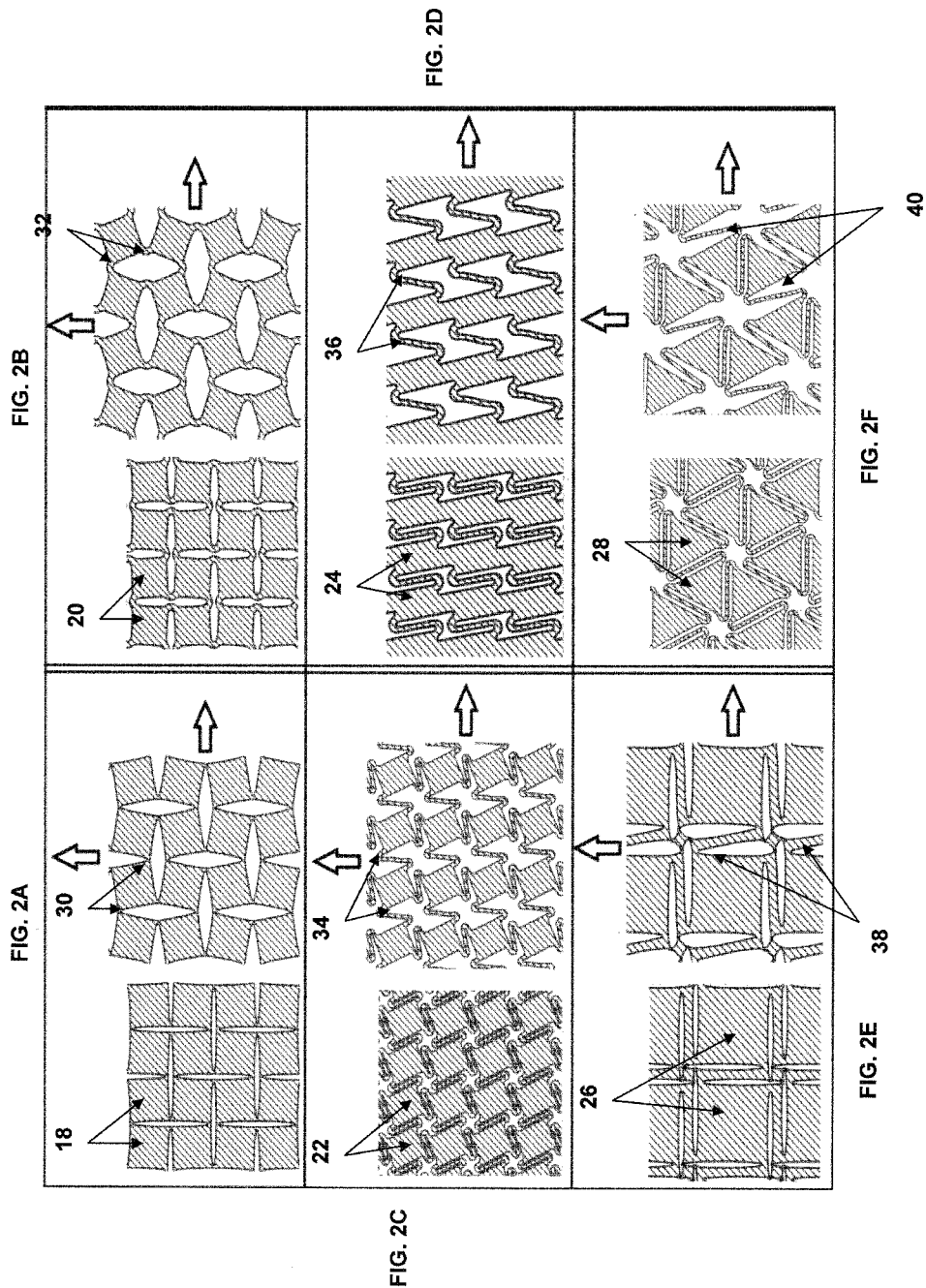

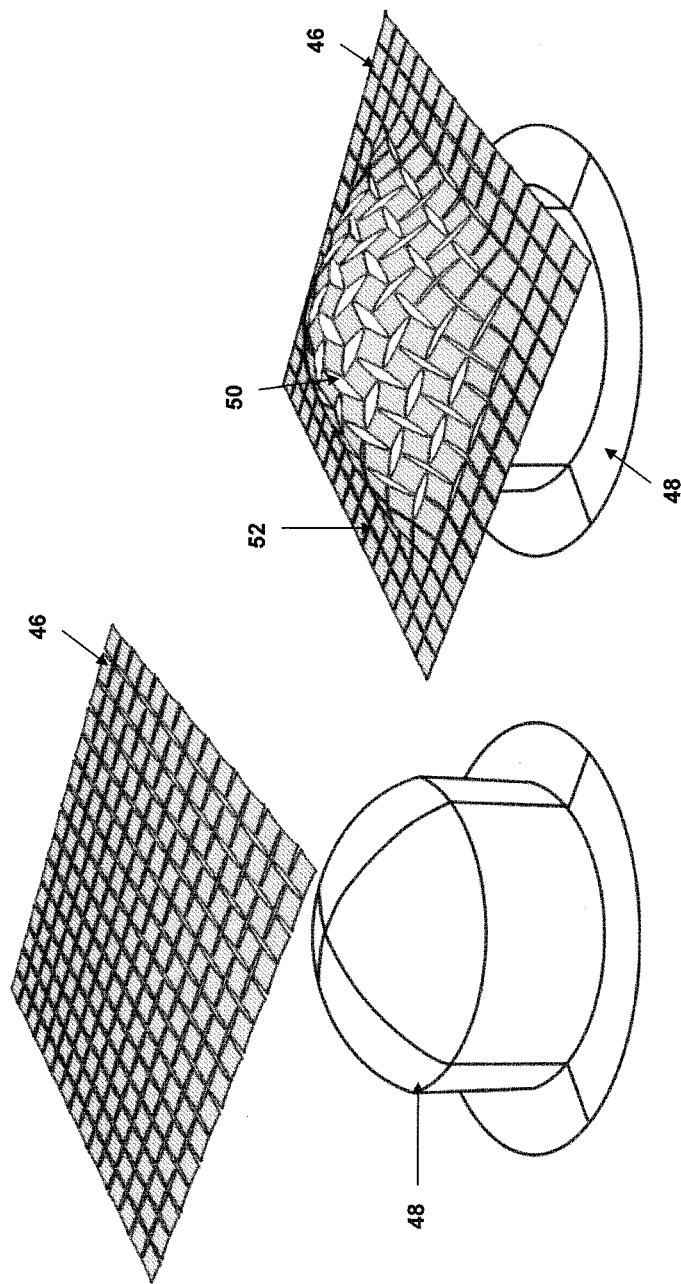

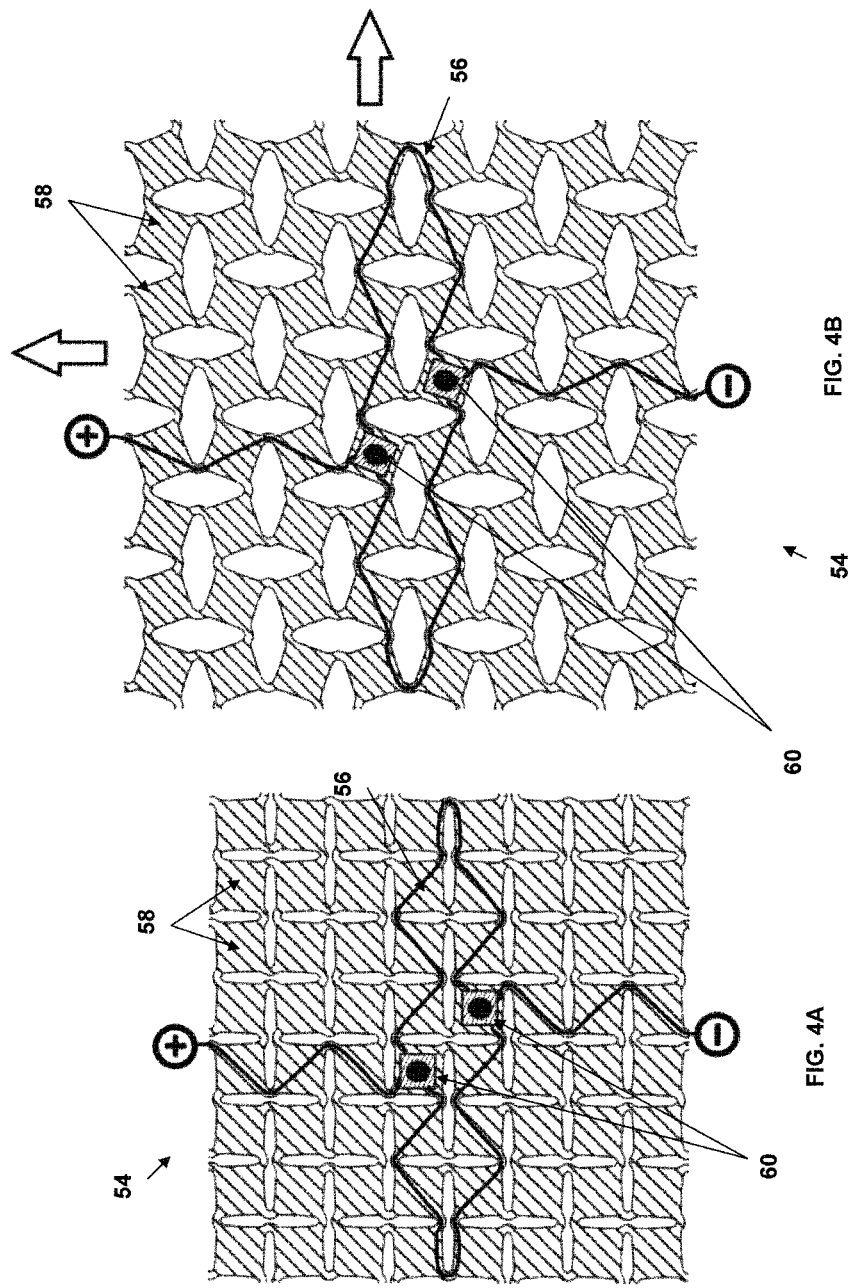

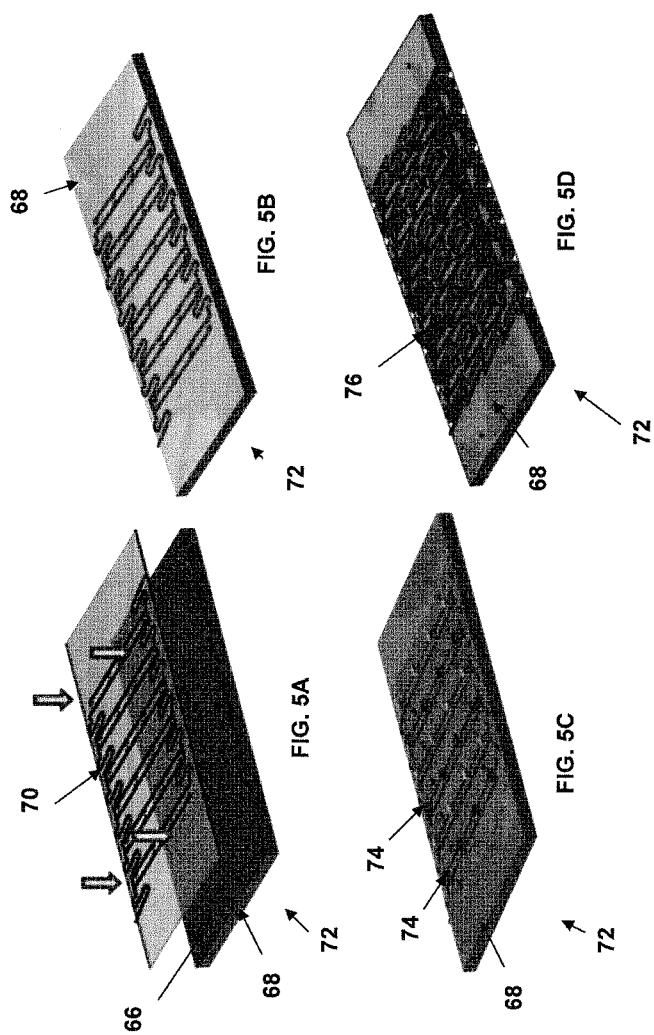

STRUCTURED MATERIAL SUBSTRATES FOR FLEXIBLE, STRETCHABLE ELECTRONICS

PRIORITY INFORMATION

This application claims priority from provisional application Ser. No. 61/221,542 filed Jun. 29, 2009, Ser. No. 61/265,256 filed Nov. 30, 2009, and Ser. No. 61/320,747 filed Apr. 4, 2010, all of which are incorporated herein by reference in their entireties.

SPONSORSHIP INFORMATION

This invention was made with Government support under W31P4Q-09-C-0473 awarded by the U.S. ARMY. The Government has certain rights in the invention.

BACKGROUND OF THE INVENTION

The invention relates to the field of stretchable, flexible and conformable integrated devices, including electronics, photovoltaics, antennas, and other integrated devices. In particular the invention relates to substrate designs that exhibit regions with low strain when subjected to larger macroscopic strain.

Current, large-scale commercial technology for integrated electronic devices is primarily based on rigid (stiff) printed circuit boards. The rigid boards serve as the support for the electronic components and conductive interconnects (traces), and also limit the magnitudes of strain and stress that are transmitted to the components and traces. It is necessary to limit the strains and stresses transmitted to these components and traces to avoid mechanical failure, and to ensure continuous electronic function.

As electronic devices become increasingly pervasive in all aspects of life, researchers, inventors and industries are seeking alternative designs for providing stretchability, flexibility, and/or conformability to these devices ("flexible electronics", "stretchable electronics"), in order to increase the design space and allow novel applications.

Several intermediate solutions exist, most notably commercial rigid-flex technologies, where rigid printed circuit boards are connected by flexible/ribbon interconnects. These solutions have only partially achieved the desired flexibility and stretchability, while introducing additional manufacturing/assembly challenges and costs.

Two general approaches have been taken in seeking a means to enable flexible electronics: (1) making conductors from a material that exhibits both conductivity and stretchability or flexibility, and (2) changing the base circuit board from a stiff material to a stretchable and/or flexible material. Due to fundamental limitations with the developments which have been made thus far, neither approach has yet to provide a large-scale commercial flexible/stretchable electronic technology.

With regards to the approach of using flexible conductive materials, several developments have been made using flexible conjugated polymers with conductive properties embedded/deposited/printed in/on a continuous stretchable substrate. Problems related to the attachment of commercial electronic components to the stretching substrate without transmission of forces that will tend to either fracture or detach the components have not been resolved in a manner compatible with current industrial electronic manufacturing processes. Furthermore, a fundamental limitation of this approach is that current polymeric conductive materials have excessive impedance, severely limiting the applications that can employ these materials. Metallic interconnects are currently the only solution compatible with a majority of electronic devices.

With regards to the approach of substituting the base circuit board with a flexible substrate, several developments have been made employing several methods to create "stretchable metallic interconnects." Most commonly, unsupported "meandering" metallic interconnects, including serpentine and coiled configurations, are employed.

Stretchable devices using unsupported metal interconnects suffer from two primary problems. First, these approaches introduce a number of challenging intermediate fabrication steps, completely incompatible with conventional industrial electronic manufacturing processes. Second, these devices are prone to failure when deformed, as either the unsupported leads or the connection of the leads to the substrate carrying the electronic components tend to fail under the forces necessary to stretch the interconnects.

In another approach stretchable interconnects are created by embedding/depositing metallic traces in/on a continuous stretchable (elastomeric) substrate, laying out the circuitry in a wavy pattern in the plane of the substrate (sinusoidal or saw tooth type of pattern), which would unbend when stretched in one direction without inducing much strain on the circuitry. This approach only applies to the wire leads and does not address chips and other, functional elements.

Currently, several research groups have made a number of contributions in developing flexible electronics. The basic element of many of these designs is in a related approach, a thin conducting metallic film is used to create interconnects on a soft substrate. The conducting film has limited strain capability and is typically first put into a pre-compressed state by applying some form of pre-stretch which gives a final buckled or twisted structure for the metallic film. The film then accommodates macroscopic strain by "unbending" or "straightening out the undulations" when the multilayer film as a whole is strained in tension or other loading. Several groups have utilized pre-set out-of-plane buckling of conductive traces on a continuous stretchable substrate as a mechanism to enable stretchable circuits.

Stretchable interconnects technology where metallic traces are embedded in a wavy pattern along the surface of a continuous stretchable substrate present a number of shortcomings. If the traces are compliant (thin traces) the stretch of the traces is equal to the macroscopic stretch of the substrate, and limited deformations can be accommodated without compromising circuit integrity. If the traces are not compliant and limit the local level of deformation, interfacial stresses will arise that will tend to detach the traces from the stretching substrate. If the traces are wavy or pre-buckled out-of plane, the necessary manufacturing methods are not compatible with current industrial electronic manufacturing processes. Finally, problems related to the attachment of commercial electronic components to the stretching substrate without transmission of forces that will tend to either fracture or detach the components have not been resolved in a manner compatible with current industrial electronic manufacturing processes. The underlying limitation of this approach lies in the fact that the stretchable substrate is continuous, and therefore experiences local levels of stretch, around interconnects and electronic components, which are comparable to the imposed macroscopic stretch on the device.

In short, all of these approaches have failed in facilitating large-scale flexible/stretchable electronics production. Furthermore, different limiting factors make each approach incompatible with the current industrial manufacturing capabilities and unable to support circuit complexities comparable with the current generation of rigid, rigid-flex, and flex electronics.

SUMMARY OF THE INVENTION

According to one aspect of the invention, there is provided a flexible and stretchable patterned substrate. The flexible and stretchable patterned substrate includes a strain-permitting material having a patterned conformation that allows the flexible and stretchable patterned substrate to experience local strain or local strain domains lower than the macroscopic strain of the flexible and stretchable patterned substrate.

According to another aspect of the invention, there is provided a method of forming a flexible and stretchable patterned substrate. The method includes providing a strain-permitting material. Also, the method includes forming a patterned conformation on the strain-permitting material that allows the flexible and stretchable patterned substrate to experience local strain or local strain domains lower than the macroscopic strain of the flexible and stretchable patterned substrate.

BRIEF DESCRIPTION OF THE DRAWINGS

FIGS. 1A-1B are schematic diagrams for two structured material substrates (SMSs) that facilitate continuous low strain regions throughout a substrate;

FIGS. 2A-2F are schematic diagrams illustrating various SMS designs, incorporating different SRFs shapes;

FIGS. 3A-3B are schematic diagrams illustrating the drapability of a patterned SMS;

FIGS. 4A-4B are schematic diagrams illustrating an electronic device formed in accordance with the invention;

FIGS. 5A-5D are process flowgraphs illustrating one possible sequence of manufacturing steps for a printed circuit board (PCB) (steps 5A-5B) and complete integrated device (5C-5D) having copper as a conductive interconnect or trace.

DETAILED DESCRIPTION OF THE INVENTION

Figure 6B:
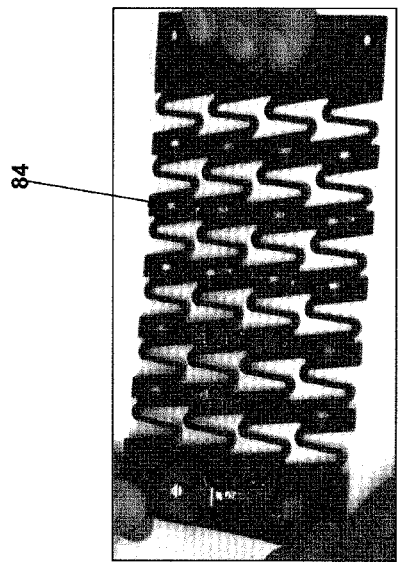
FIGS. 6A-6D are photographs of a stretchable integrated electronic device industrially fabricated through the disclosed manufacturing method.

The invention provides a design for flexible stretchable and conformable substrates for integrated devices and method to manufacture stretchable, flexible and conformable integrated devices, including electronics, photovoltaics, antennas, and other integrated devices. A complete integrated device consists of a base substrate, with a system of conductive interconnects or "traces", housing the necessary components (electronic components for an electronic device, photovoltaic cells for a photovoltaic device, etc.). The base substrate with the conductive interconnects will hereafter be referred to as a printed circuit board or PCB. The electronic (or photovoltaic, or sensor, etc.) components will hereafter be referred to as simply components or chips.

The integrated device includes a flexible structured material substrate (SMS) having a patterned conformation that allows the substrate to experience local strains lower than the macroscopic strain imposed on the integrated device. The SMS will be made of a flexible strain-permitting material, comprising but not limited to unfilled or filled vulcanized rubbers, natural or synthetic rubbers, crosslinked polymers, crosslinked elastomers, block copolymers, segmented copolymers, thermoplastic polymers, or thermoplastic vulcanizates, and epoxies. The strain permitting properties of the material will allow the SMS to experience areas of small, moderate or large strain without rupturing and provide shape recovery upon unloading. The SMS will be patterned with a structured (regular or irregular) system of "strain relief features" (SRFs) such as pores, slots, through holes, areas of reduced thickness, or a secondary material of contrasting mechanical behavior.

The SRFs will facilitate continuous and/or piecewise continuous low strain domains (LSDs) throughout the entire substrate—where low strain domains are defined as regions that experience strain levels (magnitude) lower than the macroscopic (average, homogenized) levels (magnitude) of strain applied to the integrated device. The SRFs are dispersed throughout the material, and are arranged such that the macroscopic strain on the integrated device is accommodated by deformation mechanisms which result in relatively smaller local strains in much of the actual substrate material regions. For example, the SRFs might rotate, translate, open, close or otherwise change shape, such that large regions of the actual substrate primarily rotate or translate, experiencing much smaller strains than the macroscopic strain. Hinge-like connecting regions will bend to accommodate the imposed macroscopic strain. However, even the hinge regions will undergo relatively small strain compared to the macroscopic strain. By placing larger components and/or groups of components on the large continuous low strain domains, and connecting them via conductive interconnects (conductive traces, signal pathways, smaller components, etc.) in the low strain hinge regions, the transmission of strains, stresses, and forces to the components and conductive interconnects when macroscopic deformations are applied to the integrated device can be significantly reduced, allowing the device to be stretchable, flexible, and conformable.

FIGS. 1A-1B illustrates two SMS structures 2, 4 that facilitate continuous low strain regions throughout the substrate. By "hinging" the connections 8, 12 between the larger LSDs 6, 10, the large domains can undergo relative rotations and translations freely, ensuring a low strain magnitude in the larger LSDs 6, 10 as well as in the interconnecting hinges/regions 8, 12. FIG. 1A shows the case of the larger LSDs 6 rotating. Also, FIG. 1A shows diagrams 3, 5 illustrating macroscopic large strains being applied to the structure 2 as indicated in the direction of stretching, while the lows strain domains experience very small local stretches. FIG. 1B shows the case of the connecting regions 12 rotating and the large LSDs 10 translating. Again, the hinging connections between the rotating regions of the substrate are free to open and close freely, reducing stress or strain concentration effects and lowering the strain in the substrate, both in the larger LSDs and in the hinge regions. Note FIG. 1B illustrates a large macroscopic strain being applied to the SMS structure 4 as indicated in the direction of stretching. Thus, this "hinging" of the connections between large LSDs is used to provide continuous low-strain regions throughout the substrate, ensuring that components, such as electronic components, photovoltaic cells, sensors, antennas, batteries, or the like, can be placed on the larger LSDs, and that circuit interconnects, such as conductive traces, signal pathways, or the like, can be applied/placed in the connecting regions, without risk of excessive straining degrading device performance, or risk of excessive interfacial stresses, which would promote debonding of the devices from the substrate.

Although the patterns of FIG. 1A-1B show the use of semi-elliptical or elliptic-like shaped voids as the strain relief features, the strain relief features can be designed to have different shapes. Similarly, while in FIGS. 1A-1B, the large LSDs 6, 10 take a square shape, the large LSD regions can be designed to take different shapes. FIGS. 2A-2F shows a variety of patterns 18-28, all of which provide very low strain in the large LSDs regions as indicated by arrows, and low levels of strain in the interconnecting regions 30-40. Here again portions of these regions 30-40 act primarily as hinges, providing continuous regions of low strain throughout the substrate. Also, the patterns can be formed by slits, cuts, through-holes, or areas of reduced thickness. While FIGS. 1A-1B and FIGS. 2A-2F show substrates with a single, repeated pattern, this invention also relates to SMS designs where different patterns of SRFs are combined in a single substrate to meet spatially varying flexibility, stretchability and conformability design requirements.

The structured substrates of FIGS. 1A-1B and 2A-2F provide a platform that can undergo large macroscopic strains while the material domains within the substrate are at substantially lower strain; the dramatic reduction in strain of the material enables the ability to place electronics, sensors, antenna, photovoltaics, thermoelectric and other such functionalities on the substrate. The SRF patterns can be tailored to withstand a wide variety of loading conditions, while still maintaining continuous low strain regions within the substrate. For example, the SRF patterns can be tailored to allow biaxial stretching or multiaxial flexibility. Thus, these substrates can be used to create devices for which conformability to double (or more complex) curvature surfaces is desired.

FIG. 3A shows a substrate 46 used in accordance with the invention. As the substrate 46 conforms to a spherical dome 48, the pores 50 at the top of the dome open, the substrate 46 undergoes biaxial extension here, while the pores 52 at the bottom of the dome 48 close, the substrate 46 undergoes area reduction here as shown in FIG. 3B. The closing of the pores 52 at the base of the dome 48 fully accommodates the local compression of the substrate 46, and the substrate does not wrinkle out of the desired curvature, as would be expected for a non-patterned substrate. This phenomenon can be generalized to any complex curvature surface by proper design of the SRFs. For example, the pattern 2 of FIG. 1A drapes optimally over the spherical dome 48, as shown in FIG. 3B, because the in-plane macroscopic substrate strains in the orthogonal x- and y-directions are coupled by the deformation pattern, while patterns 18, 22, 24 of FIGS. 2A, 2C, and 2D can drape smoothly over any double curvature surface, because the in-plane strains are uncoupled.

These designs can be applied to a wide range of stretchable, flexible, conformable electronics, sensors, displays, antenna, photovoltaics, thermoelectric and other devices. A simple flexible/stretchable electronic device 54 has been brought to physical form, as shown in FIGS. 4A-4B, using the substrate pattern 58 which is similar to pattern 2 shown in FIG. 1A. This device 54 includes two light emitting diodes (LEDs) 60 connected with conductive silver ink interconnects 56. FIG. 4A shows the device 54 without any strain and FIG. 4B shows the device 54 experiencing a macroscopic strain of approximately 25% in the directions indicated by the arrows.

Finally, it must be noted that the technologies described above are all suitable not only for single layer devices but also for multi-layer devices. The mechanical nature of these substrates, with continuous low strain regions, provides that both interconnects and components can be attached directly to the substrate. For a device with flat components and/or interconnects, several layers can be stacked on top of each other and connected. For example, a multi-layer flexible/stretchable circuit board can be fabricated by attaching electronic components to the top layer of the substrate and running conductive traces on lower layers. Note that traces on different layers can follow different patterns of connectivity, and that more than one trace can be routed along each hinged connecting region. Similarly, flexible/stretchable/conformable displays can be fabricated by placing light emitting devices on one side of the substrate, and the controlling electronics on the other side, with interconnects running through intermediate layers.

With certain SRFs patterns, the strains throughout the substrate are low enough to allow the use of copper as the conductive interconnect or trace in a printed circuit board. In these cases, the flexible/stretchable printed circuit board (PCB) can be fabricated using conventional PCB fabrication processes. The PCB can be fabricated via a variety of methods, while both the underlying substrate and the traces can be made from a variety of materials. To construct the traces, both additive and subtractive methods can be employed. For additive methods, the substrate can be patterned with a thin conductive layer (called a strike layer). The trace material (most commonly copper) can then be electroplated onto the strike layer, creating the finished PCB. For subtractive methods, a thin sheet of the desired trace material (again most commonly copper) is laminated directly to the substrate material. A mask can then be applied to the copper (e.g. via photolithography), and the non-masked copper can be etched away, creating the finished PCB. Any conductive material, including a wide variety of metals can be used for the trace material. Similarly, a wide variety of substrate materials can be used, provided that the strike layer (for additive processes), and the trace material itself (for subtractive processes), can be firmly bonded to the substrate.

The integrated device is completed by attaching chips to the PCB in a process called "assembly". The assembly process can be completed via a variety of methods, where the method chosen should fit the desired type of device (e.g. electronic, sensor, photovoltaic, battery, etc.). For example, for electronics, the chips can be attached via soldering (most commonly reflow soldering), where a solder/flux mixture is applied to the pads on the PCB as well as the feet of the chips, and then melted and cooled to form a solid conductive bond between the PCB and chip. Similarly, soldering can be used for photovoltaics, where the components are soldered directly to the PCB. Although soldering is the most common assembly method; other methods could be used e.g. conductive epoxies, conductive pastes, and adhesives, where this could be accomplished manually, or by using "pick and place" machines.

The SRFs can be imparted to the device at any time during the fabrication process, and can be imparted via a variety of methods, including (but not limited to) laser-cutting, stamping, die-cutting, and water-jetting. For example, the SRFs could be imparted directly to the substrate prior to PCB fabrication, prior to assembly, or can be imparted as a final step after assembly. The method for imparting the SRFs will vary, depending on when (at what step in the process) they are imparted. For example, if they are imparted as a first step, any method could be used, including water-jet cutting, laser-cutting, die-cutting, stamping, or even molding (where the substrate is molded with the desired SRFs). If they are imparted in a later step, after the traces have been constructed or after assembly, the options for imparting the SRFs are limited to processes where the location of the SRFs can very accurately be registered (so as not to cut through traces or components); though again, a variety of methods can be employed.

One example process for fabricating a flexible, stretchable, and conformable electronic device is shown in FIGS. 5A-5D, where the PCB is fabricated using subtractive methods, and the SRFs are imparted as a final step. The most common technique of PCB fabrication includes first bonding a layer 66 of copper to the desired substrate material 68. Next, the copper layer is coated with a photoresist, and a mask 70, having of the desired trace pattern, is applied to the copper via photolithography, as shown in FIG. 5A. The board 72 is then etched in a ferric chloride solution, which removes the unwanted copper, as shown in FIG. 5B. Finally, components 74 are attached using a reflow soldering process, as shown in FIG. 5C. For the flexible/stretchable PCB 72, the required pattern 76 can be imparted to the PCB 72 after this final assembly process using laser or die cutting, as shown in FIG. 5D.

Because patterns can be imparted to the PCB after fabrication, the invention is compatible with all conventional PCB fabrication processes (additive and subtractive), and all conventional PCB assembly processes (machine and hand placement, and reflow and hand soldering). Further, since the SRFs can be imparted after fabrication, it is not necessary to cut through both the substrate and the copper (or other trace material), but rather only the substrate needs to be cut. Since certain methods cannot be used to cut metals inexpensively e.g. low cost/low power laser-cutting, this allows the patterns to be imparted via a variety of cutting methods, including laser-cutting, stamping, and CNC milling.

Because these flexible, stretchable, and conformable integrated devices can be fabricated using all conventional industrial methods, they can be fabricated quickly and inexpensively using roll-to-roll processing, and they can achieve the same complexity as conventional rigid devices. For example, conventional rigid electronics employ PCBs that are multi-layered, with plated through holes (as well as blind and buried vias) connecting individual layers, and reference planes for impedance control. Further, conventional electronics employ both surface mount and through hole components, and include high I/O components (BGAs, FPGAs, QFPs, etc.). These flexible, stretchable, and conformable devices can also include multi-layered PCBs with plated through holes (as well as blind and buried vias) and reference planes for impedance control, as well as surface mount and through hole components and high I/O components.

Figure 6D:
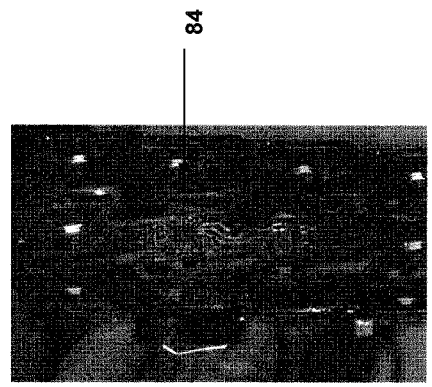
Figure 6A:
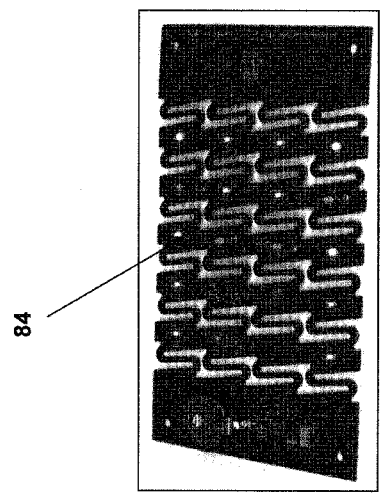
Figure 6C:
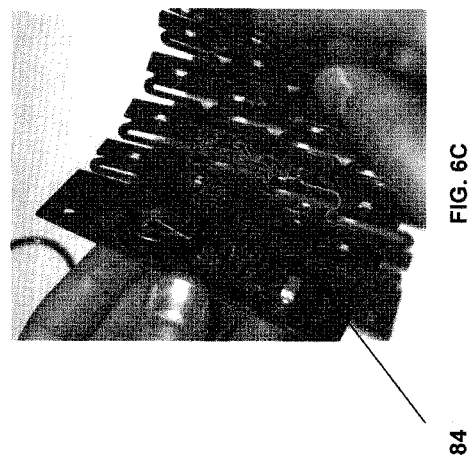

The invention has been brought to physical form, as can be seen in FIGS. 6A-6D. The integrated device is a voltage converter circuit board 84 used to drive a system of LEDs and it is shown undeformed/unloaded in FIG. 6A, stretched in FIG. 6B, flexed in a concave and convex direction in FIGS. 6C and 6D, without loss of electronic function. The PCB 84 substrate material is Kapton (polyimide), while the traces are made from copper. The PCB 84 is multi-layered (2 layers, including a reference ground plane—see FIG. 6E), includes plated through holes, uses both surface mount and through hole components, and includes one high I/O QFP chip. The device was fabricated industrially, using conventional fabrication techniques (as shown in FIGS. 5A-5D), where the PCB 84 was formed from subtractive techniques (photolithography and etching), and the components were attached via reflow soldering. The SRFs were imparted to the device in a final step via laser-cutting.

Although the present invention has been shown and described with respect to several preferred embodiments thereof, various changes, omissions and additions to the form and detail thereof, may be made therein, without departing from the spirit and scope of the invention.

What is claimed is:

1. A flexible and stretchable patterned substrate comprising a strain-permitting material having a patterned conformation including a plurality of geometrically-structured and shaped strain relief features contiguously bridging larger domains that allows the flexible and stretchable patterned substrate to experience continuous local strain or local strain domains lower than the macroscopic strain of the flexible and stretchable patterned substrate, said geometrically-structured features are patterned and tailored to withstand a plurality of loading conditions while simultaneously maintaining continuous low strain domains throughout said substrate, wherein the geometrically-structured and shaped strain-relief features between large low strain domains bend and deform to accommodate the macroscopic strain such that a continuous region of low strain is maintained in the geometrically-structured strain relief features and such that large low strain domains undergo relative translations and rotations ensuring low strain magnitude in the large low strain domains and a continuous region of low strain in the contiguous geometrically-structured strain-relief features, wherein a hinge structure that connects two adjacent low strain regions where one end of the hinge structure is coupled to a first low strain region and the other end of the hinge structure is coupled to an opposite end of a second low strain region, wherein the hinge structure includes an elongated structure having curve ends.

2. The flexible and stretchable patterned substrate of claim 1 further comprising one or more geometrically-structured strain relief features that enable regions of local low strain.

3. The flexible and stretchable patterned substrate of claim 1, wherein the local strain domains are connected by geometrically-structured strain-relief features to form a continuous region where local stretches are less than the macroscopic stretches applied to the integrated device.

4. The flexible and stretchable patterned substrate of claim 1, wherein the patterned conformation comprises a geometrically-structured hinging mechanism connecting large substrate domains that allows the substrate to stretch and flex macroscopically while experiencing lower levels of local stretches both in the large low strain domains and in the connecting geometrically-structured hinges.

5. The flexible and stretchable patterned substrate of claim 1, wherein the patterned conformation covers complex curvature surfaces by macroscopically stretching and contracting along the surface with only minor out-of-curvature deflections.

6. The flexible and stretchable patterned substrate of claim 1, wherein the substrate material experiences low strain, allowing integrated circuits to be constructed on the flexible and stretchable patterned substrate.

7. The flexible and stretchable patterned substrate of claim 1, wherein the patterned conformation can be tailored to achieve specific design criteria, including uniaxial and multi-axis stretchability and uniaxial and multi-axis flexibility.

8. The flexible and stretchable patterned substrate of claim 1, wherein the patterned conformation is arranged to accommodate electronics, sensors, photovoltaics, displays, batteries, thermoelectric, or antennas constructed on the flexible and stretchable substrate.

9. The flexible and stretchable patterned substrate of claim 1, wherein the flexible substrate demonstrates low strain throughout and is used to construct integrated circuits.

10. The flexible and stretchable patterned substrate of claim 1, wherein the strain-permitting material comprises unfilled or filled vulcanized rubbers, natural or synthetic rubbers, crosslinked polymers and elastomers, block copolymers, segmented copolymers, thermoplastic elastomers, thermoplastic vulcanizates and epoxies, or thermoplastic polymers.

11. A method of forming a flexible and stretchable substrate comprising:
providing a strain-permitting material;

forming a patterned conformation on the strain-permitting material including a plurality of geometrically-structured and shaped strain relief features contiguously bridging large low strain domains that allows the flexible and stretchable patterned substrate to experience continuous local strain or local strain domains lower than the macroscopic strain of the flexible and stretchable patterned substrate, said geometrically-structured strain relief features are patterned and tailored to withstand a plurality of loading conditions while simultaneously maintaining continuous low strain domains throughout said substrate, wherein the geometrically-structured and shaped strain relief features between said large low strain domains bend and deform to accommodate the macroscopic strain such that a continuous region of low strain is maintained in the geometrically-structured strain relief features and such that said large low strain domains undergo relative translations and rotations ensuring low strain magnitude in the low strain domains and a continuous low strain region in the contiguous geometrically-structured strain-relief features, wherein a hinge structure that connects two adjacent low strain regions where one end of the hinge structure is coupled to a first low strain region and the other end of the hinge structure is coupled to an opposite end of a second low strain region, wherein the hinge structure includes an elongated structure having curve ends.

12. The method of claim 11 further comprising forming one or more strain geometrically-structured relief features that enable regions of local low strain.

13. The method of claim 11, wherein the local strain domains are connected by geometrically-structured strain-relief features to form a continuous region where local stretches are less than the macroscopic stretches applied to the integrated device.

14. The method of claim 11, wherein the patterned conformation comprises a geometrically-structured hinging mechanism connecting large substrate domains that allows the substrate to stretch and flex macroscopically while experiencing lower levels of local stretches both in the large low strain domains and in the connecting geometrically-structured hinges.

15. The method of claim 11, wherein the patterned conformation covers complex curvature surfaces by macroscopically stretching and contracting along the surface with only minor out-of-curvature deflections.

16. The method of claim 11, wherein the substrate material experiences low strain, allowing integrated circuits to be constructed on the flexible and stretchable patterned substrate.

17. The method of claim 11, wherein the patterned conformation can be tailored to achieve specific design criteria, including uniaxial and multi-axis stretchability and uniaxial and multi-axis flexibility.

18. The method of claim 11, wherein the patterned conformation is arranged to accommodate electronics, sensors, photovoltaics, displays, batteries, thermoelectric, or antennas constructed on the flexible and stretchable substrate.

19. The method of claim 11, wherein the flexible substrate demonstrates low strain throughout and is used to construct integrated circuits.

20. The method of claim 11, wherein the strain-permitting material comprises unfilled or filled vulcanized rubbers, natural or synthetic rubbers, crosslinked polymers and elastomers, block copolymers, segmented copolymers, thermoplastic elastomers, thermoplastic vulcanizates and epoxies, or thermoplastic polymers.

\* \* \* \* \*